United States Patent
Voor et al.

(10) Patent No.: US 10,763,781 B2
(45) Date of Patent: Sep. 1, 2020

(54) SYSTEM AND METHOD OF CRYSTAL OSCILLATOR TEMPERATURE COMPENSATION FOR OPERATION IN EXTENDED TEMPERATURE RANGE

(71) Applicant: SILICON LABORATORIES INC., Austin, TX (US)

(72) Inventors: Thomas Edward Voor, Cedar Park, TX (US); Jeffrey A. Tindle, Austin, TX (US); Euisoo Yoo, Austin, TX (US); Wei Shen, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 109 days.

(21) Appl. No.: 16/023,001

(22) Filed: Jun. 29, 2018

(65) Prior Publication Data

US 2019/0305725 A1 Oct. 3, 2019

Related U.S. Application Data

(60) Provisional application No. 62/650,377, filed on Mar. 30, 2018.

(51) Int. Cl.
*H03B 5/04* (2006.01)
*H03B 5/36* (2006.01)

(52) U.S. Cl.
CPC .......... *H03B 5/04* (2013.01); *H03B 5/36* (2013.01)

(58) Field of Classification Search
CPC ............ H03B 5/04; H03B 5/36; H03L 1/02
See application file for complete search history.

(56) References Cited

U.S. PATENT DOCUMENTS

| | | | |
|---|---|---|---|
| 5,041,799 A | 8/1991 | Pirez | |
| 5,848,355 A * | 12/1998 | Rasor | H03L 1/026 |
| | | | 455/260 |
| 7,449,968 B1 * | 11/2008 | Cioffi | H03B 5/04 |
| | | | 331/154 |
| 9,344,095 B2 | 5/2016 | Hammes et al. | |
| 2013/0127551 A1 | 5/2013 | Rokos | |
| 2018/0006654 A1 * | 1/2018 | Scott | H03B 5/04 |

\* cited by examiner

*Primary Examiner* — Jeffrey M Shin
(74) *Attorney, Agent, or Firm* — Gary Stanford; Huffman Law Group, PC

(57) ABSTRACT

A system and method of performing temperature compensation based on temperature of a crystal. An integrated circuit includes a clock circuit, a memory, an interface developing a sense voltage indicative of a temperature of the crystal, and a controller. The memory stores compensation values including nominal values based on a nominal third order polynomial that defines a nominal frequency versus temperature relationship of a crystal design representing multiple crystals, and a pair of adjustment values derived from two temperature-frequency error points. The controller determines a temperature value based on the sense voltage, calculates a frequency offset using the temperature value and the compensation values to solve a compensated third order polynomial defining a compensated frequency versus temperature relationship of the crystal, and adjusts a clock signal of the clock circuit using the frequency offset. A Wi-Fi device may be optimized for industrial IoT operating within an extended temperature range.

20 Claims, 6 Drawing Sheets

REMAINING FREQUENCY ERROR AFTER COMPENSATION

SYSTEM AND METHOD OF CRYSTAL OSCILLATOR TEMPERATURE COMPENSATION FOR OPERATION IN EXTENDED TEMPERATURE RANGE

CROSS REFERENCE TO RELATED APPLICATION(S)

This application claims benefit of U.S. Provisional Application Ser. No. 62/650,377, filed on Mar. 30, 2018, which is hereby incorporated by reference in its entirety for all intents and purposes; this application is also related to U.S. patent application Ser. No. 15/861,953, entitled "SYSTEM, APPARATUS AND METHOD FOR ACCURATE MEASUREMENT OF OFF-CHIP TEMPERATURE," filed on Jan. 4, 2018, which is hereby incorporated by reference in its entirety for all intents and purposes.

BACKGROUND OF THE INVENTION

Field of the Invention

The present invention relates in general to crystal oscillator temperature compensation, and more particularly to a system and method of providing temperature compensation of a crystal oscillator suitable for wireless applications including Wi-Fi operating within an extended temperature range.

Description of the Related Art

Many electronic components exhibit performance variation over temperature which may negatively impact system performance. In many systems including wireless communication systems, a crystal oscillator may be used to generate a reference clock signal provided to circuitry of the wireless receiver and transmitter circuitry. Regular crystal oscillators, however, have oscillation frequency drift with temperature, which may limit the operating temperature range in a given solution when an inexpensive standard crystal is used with little or no temperature compensation. Temperature compensation as used herein refers to adjustment of frequency based on temperature or temperature change to achieve frequency stability compliance within an extended temperature range. In the industry, a popular workaround for enabling a wider operating temperature range is to use an expensive temperature-compensated crystal oscillator (TCXO) to overcome temperature effects. Temperature compensation used in popular TCXOs can achieve autonomous GPS requirements that have very accurate frequency tolerance, such as less than 1 part per million (ppm) error. TCXOs, however, are expensive and must be swept in production calibration over the full temperature range intended for operation.

Conventional temperature compensation has been used as an aid to initially receive a radio signal in a cellular network or a global positioning system (GSP) network or the like, in which the radio locks onto the signal using Automatic Frequency Control (AFC). AFC techniques are suitable for high accuracy networks having a relatively low frequency error tolerance level, such as 1 ppm or less. AFC techniques may not be suitable, however, for medium level networks such as wireless local area networks (Wi-Fi) or the like, which have a higher frequency error tolerance level, such as 20-25 ppm. Wi-Fi devices, for example, should not use AFC techniques to lock onto an Access Point (AP) because Access Points can have significant frequency error.

It is desired to provide temperature compensation for a Wi-Fi network to robustly achieve frequency stability compliance over a wide operating temperature range using a low cost crystal and thermistor. A standard low cost crystal has a temperature versus frequency relationship that may be defined by a third order polynomial. Conventional temperature compensation for such crystals often required measurement of 5 temperature points for third order polynomial fit during production calibration, or the use of a crystal that has been previously characterized at 5 temperature points including derived coefficients that must be read into device memory. A third order polynomial is usually defined by at least four measurement points. This was common over a lower operating temperature range for consumer products. Also, the calibration required very accurate temperature setting during production calibrations or characterization.

SUMMARY OF THE INVENTION

An integrated circuit according to one embodiment performs temperature compensation for a crystal oscillator based on temperature of an externally coupled crystal of the crystal oscillator. The integrated circuit includes a clock circuit, a memory, a voltage interface, and a controller. The clock circuit generates a clock signal based on an oscillation signal of the crystal oscillator. The memory stores compensation values including nominal values that are based on a nominal third order polynomial equation that defines a nominal frequency versus temperature relationship of a crystal design that represents multiple crystals, and further including adjustment values derived from the nominal values and two temperature-frequency error points that were measured using the coupled crystal. The voltage interface develops a sense voltage indicative of a temperature of the coupled crystal. The controller determines a temperature value based on the sense voltage and calculates a frequency offset using the temperature value and the compensation values to solve a compensated third order polynomial more accurately defining a compensated frequency versus temperature relationship of the coupled crystal. The controller adjusts a frequency of the clock signal based on the frequency offset.

The clock circuit may be a frequency synthesizer generating the clock signal. The sense voltage may be developed across a thermistor thermally coupled to the coupled crystal and developing the sense voltage via the voltage interface. The compensated frequency versus temperature relationship of the coupled crystal may be defined within an extended temperature range for industrial applications providing sufficient temperature compensation for wireless networks with medium level accuracy operating within the extended temperature range.

The two temperature-frequency error points may include a frequency error at a first temperature within a relatively wide room temperature range and a delta frequency at a second temperature within a relatively wide hot temperature range. The frequency error and the delta frequency may both be measured by measuring a starting temperature, measuring a frequency error, measuring an ending temperature, and averaging the starting and ending temperatures. The first and second temperatures may be measured using a thermistor thermally coupled to the coupled crystal and that is coupled to the voltage interface and used to develop the sense voltage indicative of the temperature of the coupled crystal. The first temperature may be any temperature within the room temperature range of 20 to 32 degrees Celsius, and the second temperature may be any temperature within the hot temperature range of 70 to 85 degrees Celsius.

The integrated circuit may further include a crystal interface that develops the oscillation signal, a frequency divider circuit receiving the oscillation signal and providing a switching frequency, a thermistor thermally coupled to the coupled crystal and developing the sense voltage via the voltage interface, a switched capacitor coupled between a supply voltage and the voltage interface having an equivalent resistance controlled by the switching frequency, and an analog to digital converter the converts the sense voltage to a digital sense value provided to the controller. The controller controls the frequency divider circuit to adjust the switching frequency to adjust the equivalent resistance of the switched capacitor, calculates a thermistor resistance of the thermistor based on the supply voltage, the digital sense value, and the equivalent resistance of the switched capacitor, and determines the temperature value based on the thermistor resistance.

An oscillator circuit with temperature compensation according to one embodiment includes a crystal oscillator including a crystal that provides an oscillation signal, a temperature that provides a temperature sense signal indicative of a temperature of the crystal, a frequency synthesizer that receives the oscillation signal and that provides a clock signal, a memory that stores compensation values including nominal values that are based on a nominal third order polynomial that defines a nominal frequency versus temperature relationship of a crystal design that represents multiple crystals, and further including adjustment values derived from the nominal values and two temperature-frequency error points that were measured using the crystal, and a controller. The controller determines a temperature value based on the temperature sense signal, calculates a frequency offset using the temperature value and the compensation values to solve a compensated third order polynomial defining a compensated frequency versus temperature relationship of the crystal, that provides an adjust signal to an adjust input of the frequency synthesizer based on the frequency offset.

A method of performing temperature compensation based on temperature of a crystal according to one embodiment includes providing a clock signal based on an oscillation signal generated by oscillation of the crystal, storing compensation values including nominal values that are based on a nominal third order polynomial equation that defines a nominal frequency versus temperature relationship of a crystal design that represents multiple crystals, and further including a adjustment values derived from the nominal values and two temperature-frequency error points that were measured using the crystal, receiving a sense voltage indicative of a temperature of the crystal and determining a temperature value based on the sense voltage, calculating a frequency offset using the temperature value and the compensation values to solve a compensated third order polynomial defining a compensated frequency versus temperature relationship of the crystal, and adjusting the clock signal based on the frequency offset.

The method may include thermally coupling a thermistor to the crystal for providing the sense voltage. The method may include calculating a value $F(TTH)=A*(TTH-T0)^3+(B*DFH+C)*(TTH-T0)^2+(D*DFH+E)*(TTH-T0)+F0+FE30$, in which $F(TTH)$ is the frequency offset, TTH is the temperature value determined by the controller based on the sense voltage, A, B, C, D, E, T0, and F0 are the nominal values, and FE30 and DFH are the adjustment values. The method may include adjusting a frequency of a frequency synthesizer using the frequency offset.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
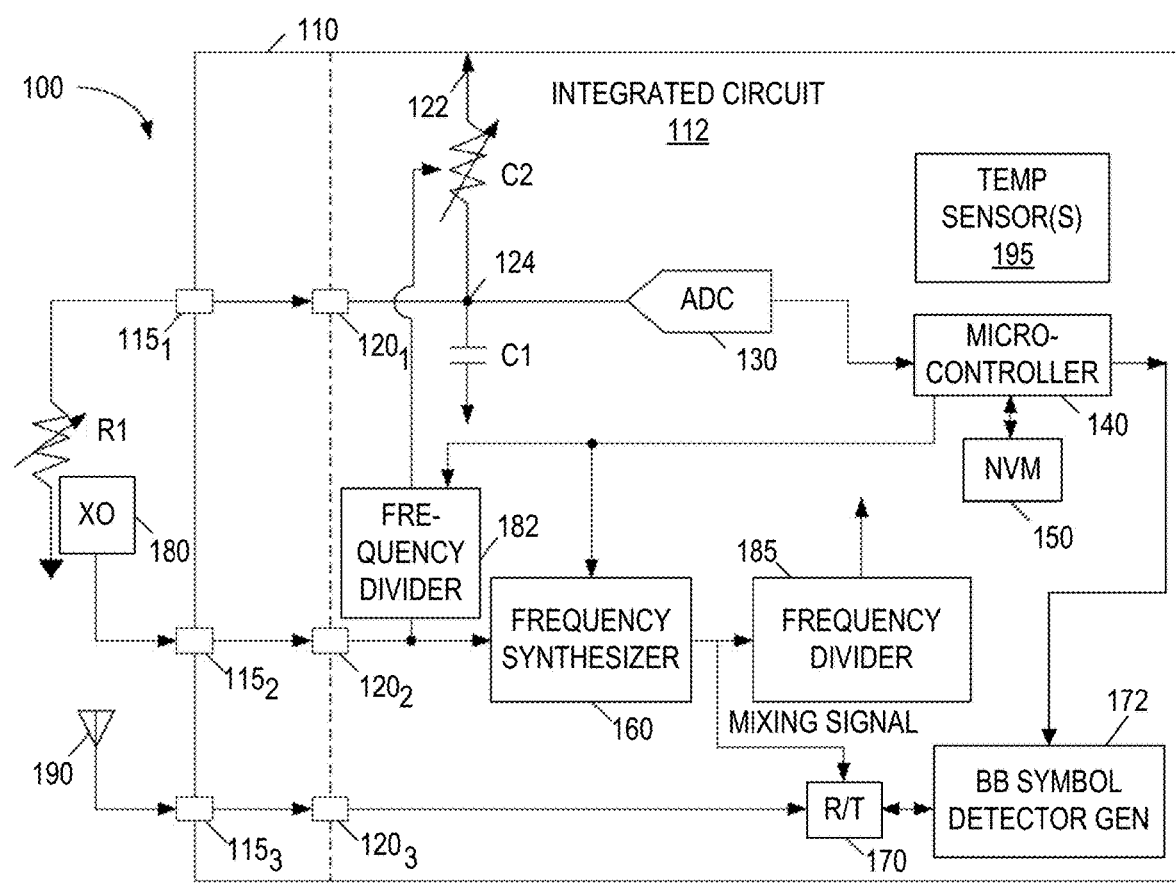
FIG. 1 is a block diagram of a system implemented in accordance with an embodiment including an integrated circuit and an externally coupled crystal oscillator and a thermistor thermally coupled to a crystal of the crystal oscillator.

The inventors have recognized the need to provide temperature compensation for medium level accuracy network devices or the like, such as Wi-Fi devices, to robustly achieve frequency stability compliance over an extended operating temperature range with a low cost crystal and thermistor combination. Frequency compliance for Wi-Fi devices generally means frequency error of no more than 20-25 ppm. The extended operating temperature range is suitable for industrial applications. A system and method of crystal oscillator temperature compensation for operation in extended temperature range as described herein includes embodiments that are optimized for Wi-Fi industrial Internet of Things (IoT). Embodiments include low cost Wi-Fi devices that may be successfully operated within an extended temperature range, such as from −40 degrees Celsius (° C.) up to 125° C.

A low cost crystal typically has a frequency versus temperature relationship defined by a $3^{rd}$ order polynomial with specific coefficients based on accurate measurement. Usually, more measurement points than the order of the polynomial are needed to derive an accurate curve fit. For example, a first order line may be defined by two points, a second order parabola may be defined by three points, and a third order polynomial may be defined by 4 points. Conventionally, at least 4 or 5 measurement points had to be made to accurately fit the curve for a specific crystal, especially to achieve sufficient accuracy within an extended temperature range. Instead, as described herein, "nominal" third order polynomial coefficients are used that define a nominal third order polynomial that may not accurately define the frequency versus temperature relationship for any one crystal (including, for example, an actual crystal being used), but instead represents a general frequency versus temperature characteristic nominally associated with a crystal design of a large number of crystals (e.g., a group or batch of manufactured crystals). In other words, the nominal third order polynomial is only an average or median curve that does not accurately represent a specific crystal but instead only generally represents characteristics of a crystal design including a large number of crystals with a relatively wide frequency error range over a specified temperature range. In this manner, the nominal third order polynomial is not sufficiently accurate for any one crystal of the group of crystals.

Nonetheless, it has been determined that only two measured temperature-frequency error points of the specific crystal are sufficient to determine two adjustment compensation values that may be used to adjust the nominal coefficients to provide a compensated third order polynomial that more accurately represents the actual frequency versus temperature of the specific crystal. The two compensation values include a frequency error expected at a specified room temperature (e.g., 30° C.) and a delta frequency at a specified hot temperature (e.g., 85° C.) relative to the frequency error at the specified room temperature. It is further noted that the two measured temperature-frequency error points of the specific crystal do not have to be measured at the same room and hot temperatures of the specified temperatures of the compensation values. Instead, each of the two measured temperature-frequency error points are made within a range of temperatures, including a room temperature range (e.g., 20-32° C.) and a hot temperature range (e.g., 70-85° C.)

Referring now to FIG. 1, shown is a block diagram of a system 100 implemented in accordance with an embodiment. As shown in FIG. 1, system 100 may be at least a portion of any type of computing system, ranging from an IoT device, industrial control system or so forth. As illustrated, system 100 includes an integrated circuit 110. Integrated circuit (IC) 110 includes a semiconductor die 112. While only a single semiconductor die is shown, it is understood that a given integrated circuit 110 may include more than one such die. In various embodiments herein, integrated circuit 110 may include wireless circuitry to act as a wireless transceiver, such as a Wi-Fi transceiver, Bluetooth™ transceiver, Zigbee™ transceiver or so forth.

For purposes of performing temperature measurements as described herein, an external thermistor R1, thermally coupled to an off-chip crystal 183 (FIG. 2) provided within a crystal oscillator 180, another off-chip component, couples via a pin $115_1$ and a pad $120_1$ to a divider node 124 to which a switched capacitor C2 couples. The pin $115_1$ and the pad $120_1$ are just one implementation of any suitable voltage interface for receiving an external voltage. In some embodiments, the crystal oscillator 180 may be implemented fully off-chip. In other embodiments, a crystal oscillator may be formed with the off-chip crystal 183 that in turn couples to on-chip components, including a load capacitance and amplifier that collectively with the crystal form the crystal oscillator. For purposes of discussion, assume FIG. 1 relates to an implementation with an off-chip crystal oscillator. Understand that while schematically shown as a programmable resistor, in one embodiment switched capacitor C2 is implemented as a metal-oxide-metal (MOM) switched capacitor, details of which are further described below. Of course other capacitor types are possible. As illustrated, switched capacitor C2 couples between divider node 124 and a supply voltage node 122. As such, the series combination of off-chip thermistor R1 and on-chip switched capacitor C2 acts as a voltage divider. Essentially, this voltage divider is implemented with switched capacitor C2 functioning as a pull-up resistor and thermistor R1 functioning as pull-down resistor. Based on the ratio of these two resistances, a sensed voltage is provided at divider node 124. Note that a capacitor C1 also may couple to divider node 124. Capacitor C1 may be part of an RC filter to reduce switching ripple prior to an input to an analog-to-digital converter (ADC) 130. Understand while shown at this high level in the embodiment of FIG. 1, many variations and alternatives are possible.

The voltage present at divider node 124 is coupled to ADC 130, which digitizes the value. In an embodiment, ADC 130 may be implemented as a 12-bit ADC. Of course in other embodiments different resolutions may be present. As an example, ADC 130 may be implemented as a sigma-delta converter; however other ADC architectures are possible. Note that in embodiments, ADC 130 may be a so-called auxiliary ADC that is adapted within integrated circuit 110 to digitize a variety of incoming analog signals. To this end, a selection circuit such as a multiplexer, not shown for ease of illustration in FIG. 1, may be coupled between divider node 124 and the input of ADC 130. When appropriately controlled to perform temperature sensing as described herein, this selection circuit may route the voltage at divider node 124 to ADC 130. In other phases of operation, other analog voltages, such as originating from various sources on-chip or off-chip (such as from one or more sensors) instead may be provided to ADC 130. Note that with a 12-bit ADC, sufficient granularity is present to detect accurate temperature changes. More specifically, with the accurate measurement circuit described herein, temperature changes of a single degree Celsius (° C.) may be represented by a relatively small change in voltage (e.g., on the order of 10 or more millivolts (mV)), with such changes accurately measured by ADC 130.

As shown, the digitized value that represents the voltage at node 124 is provided from ADC 130 to a microcontroller 140. In embodiments, microcontroller 140 may be a hardware processing circuit configured to execute instructions, including instructions for performing the temperature measurement and compensation functions described herein. In an embodiment, microcontroller 140, based upon this digitized value, a measure of the supply voltage itself (which also may be sampled by ADC 130), and the equivalent resistance Req of switched capacitor C2, may determine the resistance of thermistor R1.

It is noted that the ambient temperature at thermistor R1 and an internal temperature (or temperatures) within integrated circuit 110 may be unassociated. For example, thermistor R1 may be associated with crystal oscillator 180, which may operate at a relatively stable temperature value, such that the temperature of thermistor R1 is dependent on an ambient temperature at its location, rather than operating activity of crystal oscillator 180. In contrast, integrated circuit 110 may include various high power consuming devices, such as one or more power amplifiers that, when active during transmit operations, may cause local die temperatures to rapidly rise (and fall when powered off) without any thermal effect on thermistor R1 (and vice versa).

As such, embodiments enable accurate measurement of temperature at locations external to integrated circuit 110 in a manner independent of actual temperature changes within integrated circuit 110. That is, switched capacitor C2 may be substantially temperature stable across all operating conditions. Furthermore, the equivalent resistance Req of this switched capacitor may be dynamically controlled to be maintained at least approximately coincident with the resistance of off-chip thermistor R1 to enable accurate temperature measurements to be made. This is the case, as in typical implementations the resistance of thermistor R1 may vary significantly with temperature. As one such example, over a thermal range of approximately −40° C. to 125° C., the resistance of thermistor R1 may vary from approximately 4 mega-ohms (MΩ) to approximately 2.6 kilo-ohms (kΩ). Without using a switched capacitor as herein that provides controllable resistance, measurement accuracy would suffer. That is, if a fixed resistor were to be used instead of switched capacitor C2, the wide variation between the value of these two resistors over temperature would degrade measurement accuracy.

Embodiments thus provide more accurate measurement of the thermistor's resistance over a wide temperature range without multiple calibrations or calibrations over temperature of the measurement circuit itself (or degradation of measurement accuracy across temperature). Note that with this temperature-stable switched capacitor, temperature sensing may occur with no runtime calibrations. That is, switched capacitor C2 may be calibrated at a single temperature point one time only, e.g., during manufacturing testing. The resulting equivalent resistance of switched capacitor C2 at its testing temperature (e.g., an ambient temperature) may then be stored within integrated circuit 110 for use as described herein. Note however as described further herein to enable accurate temperature measurements to be made, the equivalent resistance of switched capacitor C2 may be dynamically changed during operation as the temperature of integrated circuit 110 itself (and also temperature of thermistor R1) varies.

With further reference to FIG. 1, note that microcontroller 140 may calculate the resistance of thermistor R1 based on the above-described voltage at divider node 124, the supply voltage, and the equivalent resistance of switched capacitor C2. In turn, this determined resistance may be used to determine a temperature of thermistor R1 (and thus its thermally coupled crystal oscillator 180). In an embodiment, microcontroller 140 may access a non-volatile memory 150 that maintains a table associating resistance values (of the external thermistor) with corresponding temperatures. As such, using the thermistor resistance as an index, a corresponding entry within this table in non-volatile memory 150 may be accessed to identify a given temperature. And in turn, in the implementation herein, a frequency synthesizer 160 of a radio portion of integrated circuit 110 may be controlled to provide temperature compensation for variations (frequency drift) in an input clock signal received from crystal oscillator 180 due to its temperature by way of control signals sent from microcontroller 140 to frequency synthesizer 160.

Thus using embodiments, a relatively low cost external crystal oscillator 180 may be used within system 100, avoiding the need for expense associated with a temperature compensated crystal oscillator (TCXO). Note that in different implementations, thermistor R1 may be implemented within a package with crystal oscillator 180, or in other cases thermistor R1 may be a separate component. In either case, thermistor R1 is thermally coupled with crystal oscillator 180.

As described above, in the embodiment of FIG. 1 integrated circuit 110 includes radio circuitry. As illustrated, incoming radio frequency (RF) signals may be received via an antenna 190 and coupled via pin $115_3$ and pad $120_3$ to receiver/transmitter circuitry 170. In embodiments, such circuitry may include various amplification and other gain control circuitry, downconversion circuitry, baseband processing circuitry and so forth. In addition, similar circuitry for upconverting baseband signals to RF levels also may be present to enable transmission of RF signals.

As further illustrated in FIG. 1, frequency synthesizer 160, which may be implemented in an embodiment as a phase lock loop (PLL), receives an input clock signal from crystal oscillator 180, via pin $115_2$ and pad $120_2$. The pin $115_2$ and the pad $120_2$ are just one implementation of any suitable crystal interface for coupling to an external crystal or crystal oscillator. In turn, frequency synthesizer 160 may be controlled to generate one or more clock signals for use within integrated circuit 110. Of interest here, frequency synthesizer 160 may generate at least one clock signal that acts as a mixing signal, e.g., a local oscillator (LO) frequency signal, to downconvert (and upconvert) signals within receiver/transmitter (R/T) circuitry 170. The R/T circuitry 170 is coupled to a baseband (BB) symbol detector generator 172, and the microcontroller 140 may adjust the clock of the BB symbol detector generator 172. For Wi-Fi configurations, for example, it is desired that the symbol rate frequency error and RF down conversion frequency error be sufficiently close to each other. Furthermore, this signal may be provided to a frequency divider 185. Frequency divider 185 may be programmably and dynamically controlled to adjust its frequency division ratio to output other clock signals. As further illustrated in FIG. 1, the input clock signal from crystal oscillator 180 further is provided to another frequency divider 182, which may be programmably and dynamically controlled to adjust its frequency division ratio, to output a switching signal provided to switched capacitor C2 to control its equivalent resistance as described herein. In other cases, more frequency dividers may be present, and in such cases, the LO signal may be output from one of these additional frequency dividers.

Figure 2:
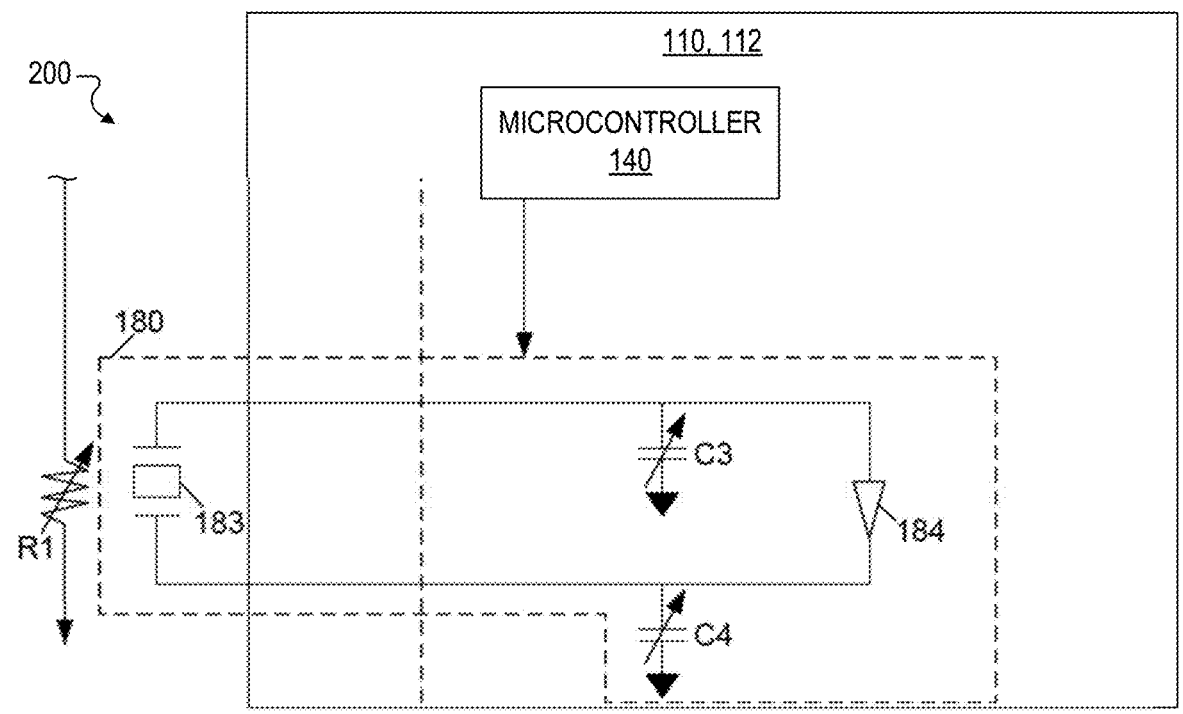
FIG. 2 is a block diagram of a system in accordance with another embodiment including an integrated circuit and an externally coupled crystal and a thermistor thermally coupled to the crystal in which the crystal is part of a crystal oscillator partially implemented on an integrated circuit of the system.

In other cases, a crystal oscillator can be implemented using an off-chip crystal and on-chip components. Referring now to FIG. 2, shown is a block diagram of a system 200 in accordance with another embodiment of the present invention. As shown, system 200 may be generally implemented the same as system 100, in which the integrated circuit 110 and semiconductor die 112 are substantially the same except that the crystal oscillator 180 is implemented with the off-chip crystal 183 that couples to load capacitors C3 and C4 on the integrated circuit 110 that in turn further couple to input and output of an amplifier 184. Collectively these components form the crystal oscillator 180.

It is noted that the off-chip crystal 183 may be separately or commonly packaged with thermistor R1. In either case, as with the above embodiment, the resistance of thermistor R1 may be measured and used to identify a temperature of crystal 183. In turn, microcontroller 140 may generate control signals to dynamically control a capacitance of load capacitors C3, C4 to perform frequency correction for temperature variations in crystal 183. Furthermore, while not shown for ease of illustration, understand that a reference clock signal generated by crystal oscillator 180 may be used for controlling various logic and circuitry of integrated circuit 110. This clock signal or another clock signal generated by way of a frequency divider (not shown for ease of illustration in FIG. 2) may be used to control equivalent resistance of switched capacitor C2. It is also understood that integrated circuit 110 itself may take various forms, and may include logic circuitry, ADC circuitry, potentially radio circuitry and so forth.

Figure 3:
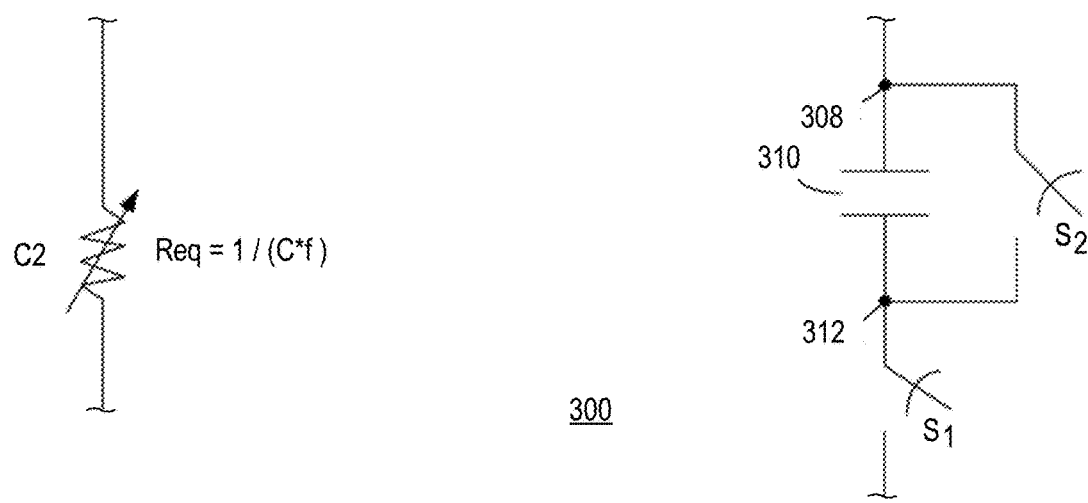
FIG. 3 is a schematic diagram of the switched capacitor of FIG. 1 in accordance with one embodiment.

Referring now to FIG. 3, shown is a schematic diagram of a switched capacitor 300 in accordance with an embodiment. The switched capacitor 300 is implemented with a fixed capacitance 310 (coupled between a first node 308 and a second node 312) and switches S1 and S2. More specifically, switch S2 couples in parallel with the plates of capacitor 310, while in turn switch S1 couples to second node 312. In embodiments, when switch S2 is closed (and switch S1 is open) capacitor 310 is discharged. In turn, when switch S2 is opened and switch S1 is closed, capacitor 310 charges capacitor C1 (of FIG. 1) via second node 312. Note that capacitor C1 may be used to reduce switching ripple. Capacitor 310 may be implemented as a MOM capacitor formed on multiple layers of a semiconductor die. In embodiments herein, with this MOM capacitor configuration, there is very little difference in capacitance over operating temperatures. And as such, a single, e.g., factory calibration of capacitance may be performed, with a calibrated equivalent resistance stored in a non-volatile storage of the integrated circuit. Note that while this capacitance value does not change over temperature, the equivalent resistance of switched capacitor 300 may be dynamically controlled during operation by changing the switching frequency. In embodiments, the equivalent resistance of switched capacitor 300 may be equal to $1/(C*f)$, where C is the capacitance value of capacitor 310, f is the switching frequency, and the asterisk "*" denotes multiplication.

The integrated circuit 110 or semiconductor die 112 including a measurement circuit as described herein may further include one or more on-chip temperature sensor(s) 195 (FIG. 1). A different temperature sensor may be provided at or near heat generating circuitry or components on the integrated circuit 110 or semiconductor die 112, such as power amplifiers (not shown), digital circuitry, the microcontroller 140, etc. Note that each temperature sensor 195 may not be suitable for determining temperature of the external crystal oscillator 180. This is so for several reasons. First, such on-chip temperature sensor(s) (which in an embodiment may be implemented as a band gap reference circuit) may not have sufficient accuracy to measure the external crystal oscillator temperature to a desired level of accuracy (e.g., less than approximately +/−1° C.). Second, there may be a temperature difference between the IC 110 and the off-chip thermistor R1 greater than a desired accuracy.

Figure 4:
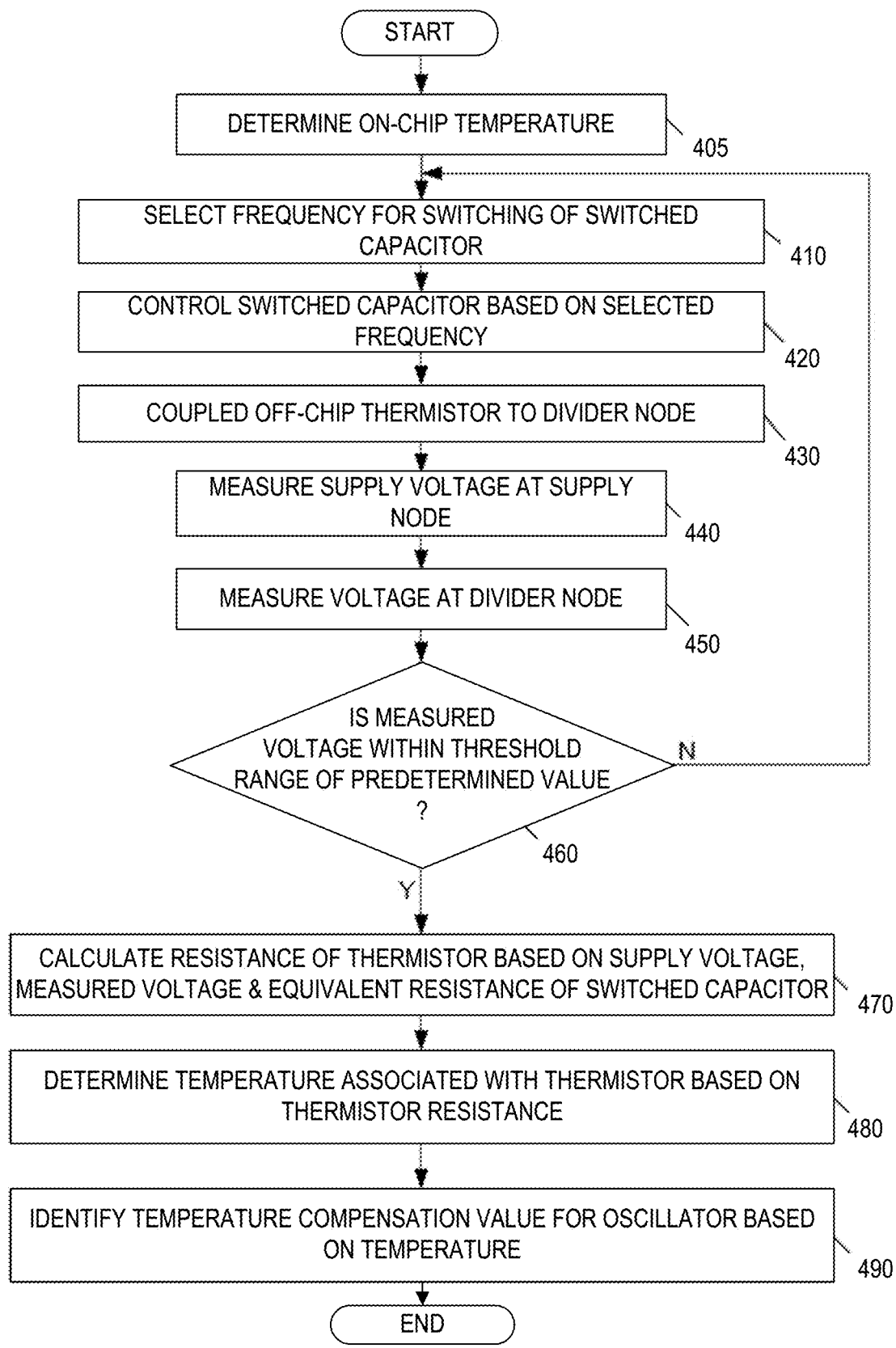
FIG. 4 is a flowchart diagram illustrating a method for sensing temperature at a location external to an integrated circuit using sensing circuitry of the integrated circuit in accordance with an embodiment.

FIG. 4 is a flowchart diagram illustrating a method for sensing temperature at a location external to an integrated circuit using sensing circuitry of the integrated circuit in accordance with an embodiment. The illustrated method may be performed by hardware circuitry, software, firmware and/or combinations thereof, such as executed on the microcontroller 140 of the system 100 or 200. For example the microcontroller 140 may be configured to execute instructions stored in a non-transitory storage medium to perform the illustrated method. For purposes of discussion, it is assumed that the external location is associated with the off-chip thermistor R1, which may be included in a package with the crystal 183 or within a complete crystal oscillator such as the crystal oscillator 180. Or in other cases, the external thermistor R1 may be a standalone component (possibly thermally coupled to a crystal oscillator) or simply a thermistor positioned at a location, e.g., on a circuit board, within a system or at another location at which temperature is to be sensed.

Operation begins at block 405 in which the on-chip temperature is determined, such as using one or more of the temperature sensors 195. Operation proceeds to block 410 in which the determined on-chip temperature is used to select a frequency for switching of the switched capacitor C2, such that a given equivalent resistance Req of the capacitor C2 may be generated. As shown in FIG. 3, for example, the switches $S_1$ and $S_2$ coupled to the capacitor 310 are alternatively switched based on the selected frequency f to control Req associated with C2. In alternative embodiments, a predetermined value, such as an ambient temperature condition value, e.g., stored in the NVM 150 or other storage may be selected. In other cases, this frequency selection may be based on a previous setting, a temperature of the IC 110 or so forth. In any event, control advances to block 420 where the switched capacitor C2 is controlled based on the selected frequency. That is, the switched capacitor C2 may be alternately charged and discharged according to a clock signal having this selected switching frequency. Still further, at block 430 the off-chip thermistor R1 may be coupled to the divider node 124, which couples the switched capacitor C2 to the thermistor R1. This coupling may occur dynamically, e.g., by way of a switch, such that the thermistor R1 is coupled to the divider node 124 for purposes of sensing temperature. Operation proceeds to block 440 in which the supply voltage at the supply node 122 is measured, then to block 450 in which the voltage at the divider node 124 is measured, and then to block 460 in which it is queried whether the measured voltage is within a threshold range of a predetermined value. If not, operation returns to block 410.

If it is determined that the measured voltage is within this threshold range, control passes to block 470 in which a calculation of a resistance Rtherm of the thermistor R1 may be made. More specifically, Rtherm may be calculated based on the measured supply voltage 122, the measured voltage of the divider node 124 and the equivalent resistance Req of the switched capacitor C2. In one particular embodiment, Rtherm is calculated using a ratio of the supply voltage and the voltage on the thermistor according to the following equation (1):

$$Rtherm = \frac{Vsense}{Vsupply - Vsense} * Req \tag{1}$$

where Vsense is the measured voltage at the divider node 124, Vsupply is the measured supply voltage 122, and Req is the equivalent resistance of the switched capacitor C2. Since a ratio is used, and not an absolute measurement accuracy of the ADC 130, any gain error due to temperature variation of the ADC 130 cancels out.

Next, control passes to block 480 where a temperature associated with the thermistor R1 (namely the temperature at the location of the thermistor) may be determined. More specifically, this determination may be based on the thermistor resistance Rtherm. In embodiments, a lookup table may be stored in non-volatile memory that includes multiple entries each having an association between thermistor resistance (or resistance range) and corresponding temperature (or temperature range). Thus based upon access to a given entry by way of the determined thermistor resistance Rtherm, a corresponding temperature can be determined. Alternately, temperature may be calculated by the microcontroller 140 based on a polynomial function that maps thermistor resistance Rtherm to temperature.

Different use cases for this temperature may be possible. For example, in some cases such as where the measurement circuit is part of a thermostat, a thermometer or so forth, the temperature may be provided, e.g., to a display or to a control circuit that controls an air conditioning, heating or other HVAC system based upon this value, or so forth. As described further herein, this temperature, referred to as TTH, is used to perform temperature compensation of the crystal oscillator 180 thermally coupled with the thermistor R1.

At next block 490, the determined temperature TTH may be used to identify a temperature compensation value F(TTH) for the crystal oscillator 180. As described further herein, based upon this determined temperature TTH, the microcontroller 140 performs a polynomial calculation using compensation factors stored in the NVM 150 that are determined, at least in part, during a compensation process performed during production. In turn, this temperature compensation value F(TTH) may be provided to the frequency synthesizer 160 to compensate for variations in the incoming clock signal received from the crystal oscillator 180. When the load capacitors C3 and C4 provided for the crystal oscillator 180 are included on-chip as shown for system 200, temperature compensation may include control signals from the microcontroller 140 that dynamically tune one or both capacitors C3 and C4 to compensate for temperature variation. With this thermal compensation for frequencies generated by the frequency synthesizer 160, frequency drift of the crystal oscillator 180 over temperature may be sufficiently compensated to maintain required frequency stability for a given wireless communication protocol.

Note that with the techniques described herein, accurate measurement may be realized by dynamically controlling the equivalent resistance Req of the switched capacitor. In this way, as the thermistor resistance Rtherm varies, the corresponding switched capacitor equivalent resistance Req may be varied to maintain measurement accuracy. This is so, because large differences between these two resistances degrade measurement accuracy. It is noted that a calibration process to calibrate the equivalent resistance of the switched capacitor C2 may proceed during manufacturing or production testing. In such process, the integrated circuit 110 may couple, e.g., via a general purpose input/output (GPIO) pin to a known precision resistor. In turn, the switching frequency for the switched capacitor C2 may be selected so that its equivalent resistance Req is similar to the resistance of this known precision resistor. Thereafter, the voltage at the divider node 124 may be measured. With this value, the supply voltage and the known external resistance, the equivalent resistance may be determined according to the following equation (2):

$$Req = \frac{Vsupply - Vmeasured}{\left(\frac{Vmeasured}{Rext}\right)} \quad (2)$$

where Vmeasured is the voltage at the divider node, and Rext is the known external resistance. This determined equivalent resistance Req may be stored in the NVM 150 as a baseline equivalent resistance for the given switching frequency.

Figure 5:
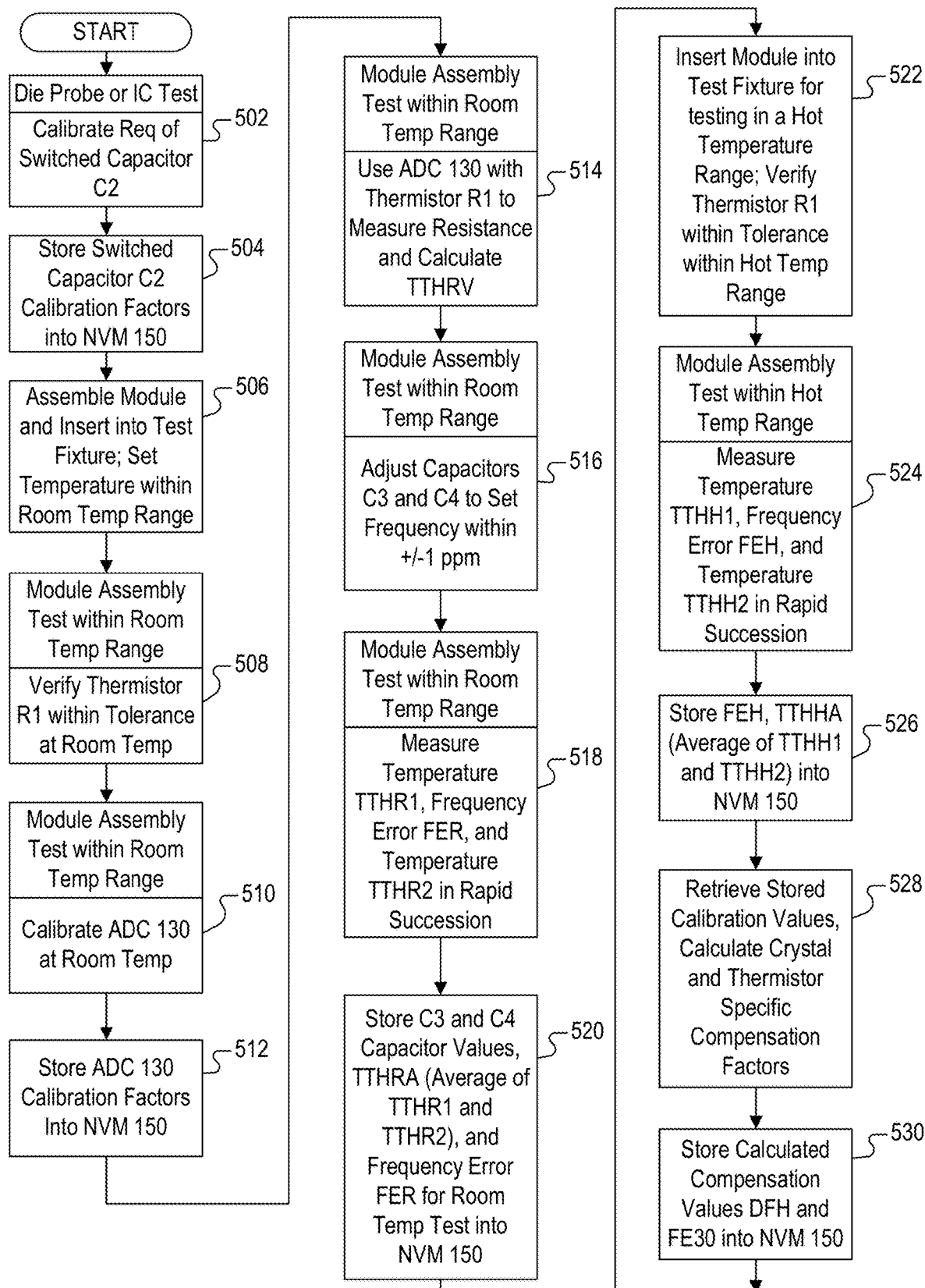
FIG. 5 is a flowchart diagram of a production process for temperature compensation of the crystal of the crystal oscillator of either FIG. 1 or FIG. 2 according to one embodiment.

FIG. 5 is a flowchart diagram of a production process for temperature compensation of the crystal 183 of the crystal oscillator 180 according to one embodiment. The production process is applicable to any configuration (e.g., systems 100 or 200) in which a crystal (e.g., the crystal 183) is provided external to an IC (e.g., the IC 110) and thermally coupled to a thermistor, such as the thermistor R1. At a first block 502, the calibration process for determining the equivalent resistance Req of the switched capacitor C2 is performed as previously described. At next block 504, the capacitor calibration factors determined during the calibration procedure of block 502 are stored into the NVM 150. At next block 506, a module incorporating the IC 110, the thermistor R1 and the crystal oscillator 180 (e.g., such as systems 100 or 200 with or without antenna 190) is assembled and the module is inserted into a test fixture for temperature compensation calibration. The temperature is initially set within a predetermined room temperature range. A specific room temperature may be specified, such as 25° C. or 30° C. or the like. Alternatively, the room temperature may be any temperature within the predetermined room temperature range, in which the actual temperature is stated as being "at" room temperature if the temperature is within the predetermined room temperature range. In one embodiment, the room temperature range is 20° C. to 32° C. The test equipment includes a precision temperature sensor that measures the actual temperature of the module at room temperature, referred to as TRPRB.

At next block 508, the thermistor R1 is verified at room temperature within a specified tolerance. In one embodiment, a calculated temperature TRTV is determined from the measurement of the resistance of the thermistor R1 at room temperature before any power is applied to the module. In this case, TRTV is calculated by the test equipment based on external resistance measurement Rtherm of the thermistor R1 by the test equipment rather than using the module. In one embodiment, TRTV may be measured by applying a predetermined voltage level to the thermistor R1 while measuring the current through the thermistor R1. The applied voltage should be sufficiently low to minimize the effect of forward bias current of the unpowered integrated circuit 110 while it is turned off. In one embodiment, a voltage level of approximately 500 mV is applied. In order to verify the thermistor R1, the calculated value TRTV should be within a temperature error threshold TERR1 of TRPRB. In one embodiment, TERR1 is +/−4° C., although the specified temperature threshold may vary for different configurations. If the thermistor R1 is not verified, then the test procedure may be terminated so that the thermistor R1 or the module may be evaluated.

After the thermistor R1 is verified, operation proceeds to block 510 to calibrate the ADC 130 at room temperature. At this point, the module including the integrated circuit 110 is powered on so that the ADC 130 and the microcontroller 140 may be accessed. The particular calibration procedure performed depends upon the particular type of ADC 130 and many different algorithms are known for ensuring accuracy. Once calibrated, operation proceeds to block 512 in which the determined ADC calibration factors are stored into the NVM 150.

Operation advances to block 514 in which the ADC 130 and the thermistor R1 are used to measure resistance and calculate a temperature TTHRV at room temperature. The calculated temperature value TTHRV is compared with TRTV to ensure that they are within a predetermined temperature error threshold TERR2. In one embodiment, TERR2 is +/−1.5° C., although the specified temperature threshold may vary for different configurations. If the measurement process fails, then the test procedure may be terminated so that the thermistor R1 or the module may be evaluated.

If the temperature test in block 514 passes or is otherwise successful, operation proceeds to block 516 in which one or both of the adjustable capacitors C3 and C4 are adjusted to set the frequency of the crystal oscillator 180 within +/−1 ppm of the target frequency level (TFL). The process of tuning the capacitors C3 and C4 is referred to as CTUNE. In one embodiment for a particular type of crystal 183, the TFL is 40 MHz, or in another embodiment, the TFL is 38.4 MHz. Although not shown, there may be any combination of other on-chip and off-chip capacitors as well as parasitic capacitance contributing to the overall load capacitance. The adjustable capacitors C3 and C4, if provided, enable adjustment of the oscillator frequency at room temperature. It is noted that frequency error may be determined and adjusted without making adjustments to the capacitors C3 and C4. The correction may be applied to the digital setting of the frequency synthesizer 160 along with temperature compensation to compensate for parasitic PC board capacitance, IC process variations or any other sources of production variation.

Operation then advances to block 518 in which a temperature TTHR1, a frequency error FER, and then another temperature TTHR2 are measured, preferably in rapid succession at room temperature. This is done immediately after CTUNE but before significant heat generating tests, such as testing receive (RX) and transmit (TX) functions. It is noted that the frequency error measurement takes some time since it involves counting 1 million cycles while the module is powered, so that there may be a temperature differential between TTHR1, measured before the frequency error measurement of FER, and TTHR2, measured immediately after completion of the frequency error measurement. The before and after temperature values TTHR1 and TTHR2 are then averaged to provide a room temperature value TTHRA. Since temperature varies during the frequency error measurement of FER, such that FER represents an "averaged" frequency error during the time it is measured, TTHRA is a validated measurement of the temperature of the crystal 183 coincident with the measurement of FER. In other words, both FER and TTHRA represent averaged values and are closely linked with each other. TTHRA and FER provide a first temperature-frequency error point measured at room temperature used for temperature compensation as further described herein.

It is noted that FER should be within +/−1 ppm of the TFL. If not, then another CTUNE procedure may be performed by adjusting one or both of C3 and C4 until TFL is achieved. If the CTUNE procedure is repeated, however, then the measurements of TTHR1, FER, TTHR2 may also be repeated to update FER and TTHRA.

Operation then advances to block 520 in which the determined values are stored into the NVM 150, such as the load capacitor settings (used to set the capacitor values of C3 and C4), FER, and TTHRA.

Operation then advances to block 522 for testing the module within a predetermined hot temperature range. A specific hot temperature may be specified, such as 85° C. Alternatively, the hot temperature may be any temperature within the predetermined hot temperature range similar to the room temperature range. In one embodiment, the hot temperature range is 70° C. to 85° C. The test equipment measures the actual temperature of the module in the hot temperature range, referred to as THPRB. This block includes verifying the thermistor R1 within tolerance similar to that performed at block 508. In one embodiment, a calculated temperature THTV is determined from the measurement of the resistance of the thermistor R1 in the hot temperature range before any power is applied to the module. In this case, THTV is calculated by the test equipment based on external resistance measurement Rtherm of the thermistor R1 by the test equipment rather than using the module. In one embodiment, THTV may be measured by applying the predetermined voltage level (e.g., 500 mV) to the thermistor R1 while measuring the current through the thermistor R1 in a similar manner previously described. In order to verify the thermistor R1, the calculated value THTV should be within a temperature error threshold TERR3 of THPRB. In one embodiment, TERR3 is +/−3° C., although the specified temperature threshold may vary for different configurations. If the thermistor R1 is not verified, then the test procedure may be terminated so that the thermistor R1 or the module may be evaluated.

If verified, the module including the integrated circuit 110 is powered on, and the ADC 130 and the thermistor R1 are used to measure resistance and calculate a temperature TTHHV in the hot temperature range. The calculated temperature value TTHHV is compared with THTV to ensure that they are within a predetermined temperature error threshold TERR4. In one embodiment, TERR4 is +/−2° C., although the specified temperature threshold may vary for different configurations. If the measurement process fails, then the test procedure may be terminated so that the thermistor R1 or the module may be evaluated.

Operation then advances to block 524 in which a temperature TTHH1, a frequency error FEH, and then another temperature TTHH2 are measured, preferably in rapid succession at the hot temperature. Similar to the first temperature-frequency error point measurement, the before and after temperature values TTHH1 and TTHH2 are then averaged to provide a hot temperature value TTHHA. Similar to the first temperature-frequency error point defined by TTHRA and FER at room temperature, FEH and TTHHA represent averaged values that are closely linked with each other to provide a second temperature-frequency error point measurement used for temperature compensation as further described herein. Operation then advances to block 526 in which the second temperature-frequency error point measured at block 524 is stored into the NVM 150, including FEH and TTHHA.

Operation then advances to block 528 in which the previously stored calibration values and the first and second temperature-frequency error points are retrieved (e.g., from NVM 150), and then the crystal and thermistor specific compensation factors are calculated. In the illustrated embodiment, the calculation may be an iterative process as further described herein based on nominal coefficients and the first and second measured temperature-frequency error points. In this manner, rather than having to measure 4 or 5 test points as is conventional for $3^{rd}$ order polynomials, only two test points are used along with a nominal temperature versus frequency $3^{rd}$ order polynomial coefficients describing general characteristics of a crystal design of a set or batch of crystals. The frequency offset F(TTH) (measuring in ppm) to correct for temperature induced error of a specific calibrated IC-Crystal (e.g., IC 110 with crystal 183) combination using temperature TTH in °C. of the thermistor R1 is according to the following 3$^{rd}$ order polynomial equation (3):

$$F(TTH)=A*(TTH-T0)^3+(B*DFH+C)*(TTH-T0)^2+(D*DFH+E)*(TTH-T0)+F0+FE30 \quad (3)$$

where TTH is the calculated temperature based on the reading of the voltage at the divider node 124 for the thermistor R1, T0 is a nominal temperature value and F0 is a corresponding nominal frequency error value at the inflection point, A-E are nominal coefficients, FE30 is a frequency error (in ppm) of the reference oscillator expected at a selected temperature of 30° C. with respect to the target frequency level (TFL), and DFH is the delta frequency (in ppm) at a specified hot temperature H° C. from the frequency error at 30° C. Although not used in equation (3), a nominal value DFHNOM is a nominal value for DFH, and a nominal value FE30NOM is a nominal value for FE30, but is zero for the particular crystal design being used. The specified hot temperature H° C. may be different for different embodiments, but may also be an agreed to number by convention, such as, for example, 85° C. The delta frequency DFH may alternatively be referenced as DF85 for H=85° C. (in which DFHNOM may alternatively be referenced as DF85NOM).

The compensation factors A-E, T0, F0, DFHNOM (and FE30NOM, which is zero) are nominal values that are applicable to the crystal design being used, e.g., to a batch of crystals from which the crystal 183 may have been selected. A different set of nominal values may be defined for a different crystal design for a different crystal being used. These nominal values, for example, when used in equation (3) define a nominal 3$^{rd}$ order polynomial equation representing the batch of crystals that may have included the particular crystal 183. The specific crystal 183, however, may have performance differences from the above nominal equation by an amount substantially equal to acceptable production tolerances. The DFH and FE30 compensation values are iteratively derived based on the nominal compensation factors and the first and second temperature-frequency error points (TTHRA, FER) and (TTHHA, FEH) determined for the particular crystal 183 under test. In this manner, the nominal 3$^{rd}$ order polynomial equation is adjusted using the DFH and FE30 compensation values and converted to the compensated third order polynomial of equation (3) to more accurately calculate the actual frequency of the crystal oscillator 180 during run-time operation.

The constant compensation factors A-E, T0, F0 along with the derived compensation values DFH and FE30 are then stored at block 530 into the NVM 150, and the production process for temperature compensation of the crystal 183 of the crystal oscillator 180 is completed. During operation as described further below, TTH is measured and updated, and the stored compensation factors are retrieved and applied to equation (3) for determining a new frequency offset F(TTH) used for temperature compensation based on temperature.

Figure 6:
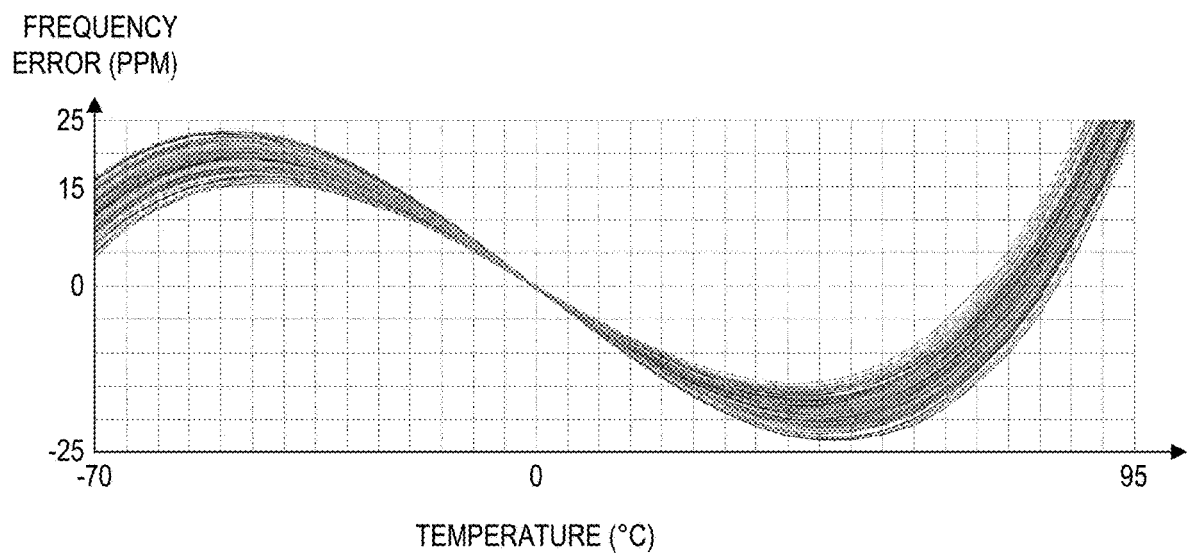
FIG. 6 is a graphic diagram plotting normalized frequency error (vertical axis, plotted in ppm) versus normalized temperature in ° C. for a relatively large number (batch or set) of manufactured crystals according to a selected crystal design.

FIG. 6 is a graphic diagram plotting normalized frequency error (vertical axis, plotted in ppm) versus normalized temperature in ° C. for a relatively large number (batch or set) of manufactured crystals according to a selected crystal design. Each plotted curve approximately follows a 3$^{rd}$ order polynomial defining the variation in frequency in response to temperature change for a corresponding crystal. Each curve converges at a nominal temperature of T0 having a frequency error of F0=0 at T0. In one embodiment, T0=30° C. in which the frequency is substantially equal to the target frequency TFL. At a minimum normalized temperature of −70 (corresponding to −40° C.), the frequency error ranges from +4 ppm to about +17 ppm having a frequency variation of about 13 ppm. There also remains a variation of more than 13 ppm at 95° C. and over 18 ppm at 115° C. It is noted that although these variations are within the overall allowable frequency error tolerance of +/−20 ppm for Wi-Fi devices, there are other sources of error so that the accumulated frequency error likely exceeds the allowable error tolerance budget. It is desired to reduce or otherwise minimize the frequency error due to temperature change of the crystal itself.

The iterative mathematical process performed at block 528 during production according to one embodiment is as follows. In a first calculation, a nominal slope frequency error value F30MN (in ppm) expected at 30° C. is calculated by adjusting the measured FER (first temperature-frequency error point) by the slope at T0 of the nominal frequency versus temperature curve of the crystal 183 according to the following equation (4):

$$F30MN=(T0-TTHRA)*(DFHNOM*D+E)+FER \quad (4)$$

where T0, DFHNOM, D and E are constant compensation values for the crystal 183. In one embodiment for a specific crystal provided by a manufacturer, T0=+30° C., DFHNOM=−17, D=+1.700E-2, and E=−3.500E-1, although these specific values usually vary with different crystals manufactured at different times or by different manufacturers. The notation "En" means "×10$^n$" (e.g., 1.7E-2=1.7×10$^2$). In a second calculation, a frequency error value F30M2 (in ppm) is determined according to the following equation (5):

$$F30M2=(T0-TTHRA)*[(FEH-F30MN)*D+E]+FER \quad (5)$$

where FEH is the frequency error at the second temperature-frequency error point determined during testing within the hot temperature range. It is appreciated that F30M2 is determined using F30MN and is a more accurate measurement of the slope at 30° C.

F30M2 is used to determine a first guess DFHG1 of the delta frequency DFH at H° C. (e.g., DF85 at 85° C.) according to the following equation (6):

$$DFHG1 = \frac{[-A*(TTHHA-T0)^3 - C*(TTHHA-T0)^2 + E*(TTHHA-TO)+FEH-F30M2]}{[B*(TTHHA-TO)^2 + D*(TTHHA-TO)]} \quad (6)$$

Then, DFHG1 and F30M2 are used to determine a first guess F30G1 of the slope at room temperature FE30 according to the following equation (7):

$$F30G1=(T0-TTHRA)*[(DFHG1-F30M2)*D+E]+FER \quad (7)$$

Then, F30G1 is used to determine a second guess DFHG2 of DFH according to the following equation (8):

$$DFHG2 = \frac{[-A*(TTHHA-T0)^3 - C*(TTHHA-T0)^2 + E*(TTHHA-TO)+FEH-F30G1]}{[B*(TTHHA-TO)^2 + D*(TTHHA-TO)]} \quad (8)$$

Then, DFHG2 and F30G1 are used to determine a second guess F30G2 of FE30 according to the following equation (9):

$$F30G2=(T0-TTHRA)*[(DFHG2-F30G1)*D+E]+FER \qquad (9)$$

The iterative process is continued in which subsequent iterations alternate between updates of the slope at room temperature (update of FE30) and curve identification (update of DFH). In particular, the calculated value F30G2 is then used to calculate a third guess DFHG3 using a calculation similar to equation (8) in which F30G2 replaces F30G1, and then DFHG3 and F30G2 are used to determine a third guess F30G3 of FE30 using a calculation similar to equation (9) in which DFHG3 replaces DFHG2 and F30G2 replaces F30G1.

In one embodiment, once the updated values are within a predetermined percentage TH % of the prior updated values during the iterative process, then the final updates are used as FE30 and DFH. For example, if after eight iterations F30G8 is within TH % of F30G7 and DFHG8 is within TH % of DFHG7, then F30G8 is used as the final value of FE30 (FE30=F30G8) and DFHG8 is used as the final value of DFH (DFH=DFHG8). In another embodiment, rather than determining whether each updated pair of values is within TH % of the previously updated values for each iteration, a specified number of guesses may initially be performed before such comparison to reduce overall computations. For example, rather than determining whether guesses 1-7 are within TH %, 8 iterations may be sequentially performed to calculate F30G8 and DFHG8, which are then compared with F30G7 and DFHG7, respectively. If not within TH %, then additional iterations may be performed. Once the desired accuracy is achieved, FE30 and DFH are determined and stored into the NVM 150.

Figure 7:
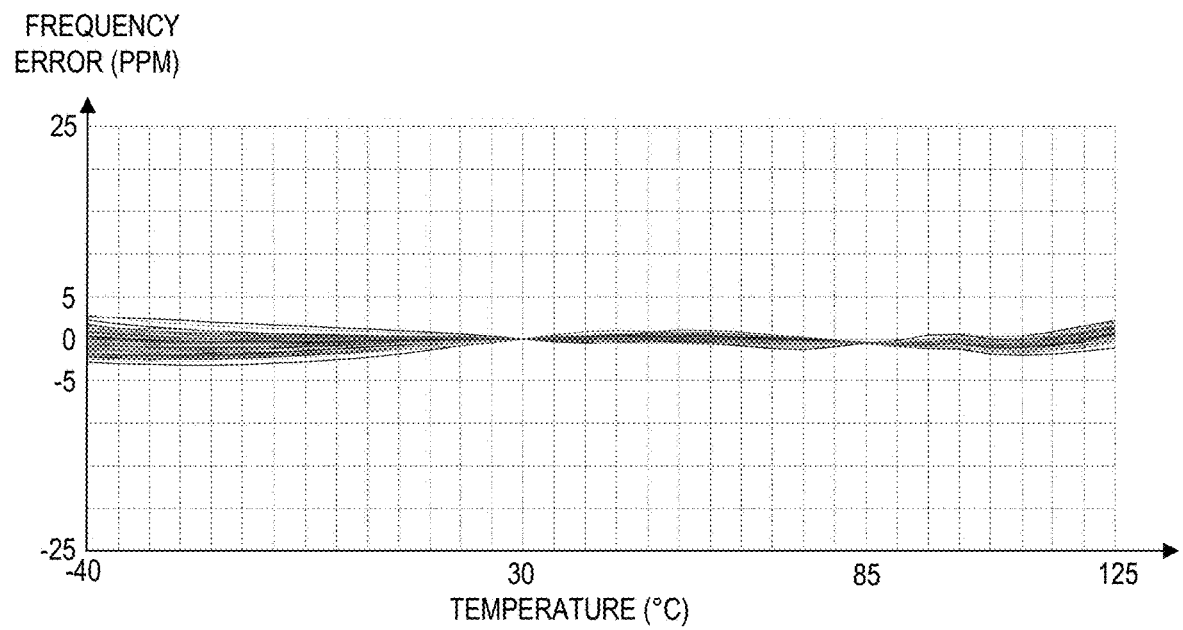
FIG. 7 is a graphic diagram plotting remaining frequency error (vertical axis, plotted in ppm) versus temperature in ° C. after temperature compensation as described herein is applied.

FIG. 7 is a graphic diagram plotting remaining frequency error (vertical axis, plotted in ppm) versus temperature in ° C. after temperature compensation as described herein is applied precisely to the data set shown in FIG. 6. At −40° C., the frequency error is reduced to +/−3 ppm, and at +125° C., the frequency error is reduced to about −1 ppm to +2 ppm. The frequency error is even less at the intermediate temperatures greater than −40° C. and less than 125° C. The frequency error at 30° C. (at room temperature) is essentially zero and the frequency error at 85° C. (selected hot temperature H) is only −0.5 ppm for each of the crystals having substantially the same nominal values.

Figure 8:
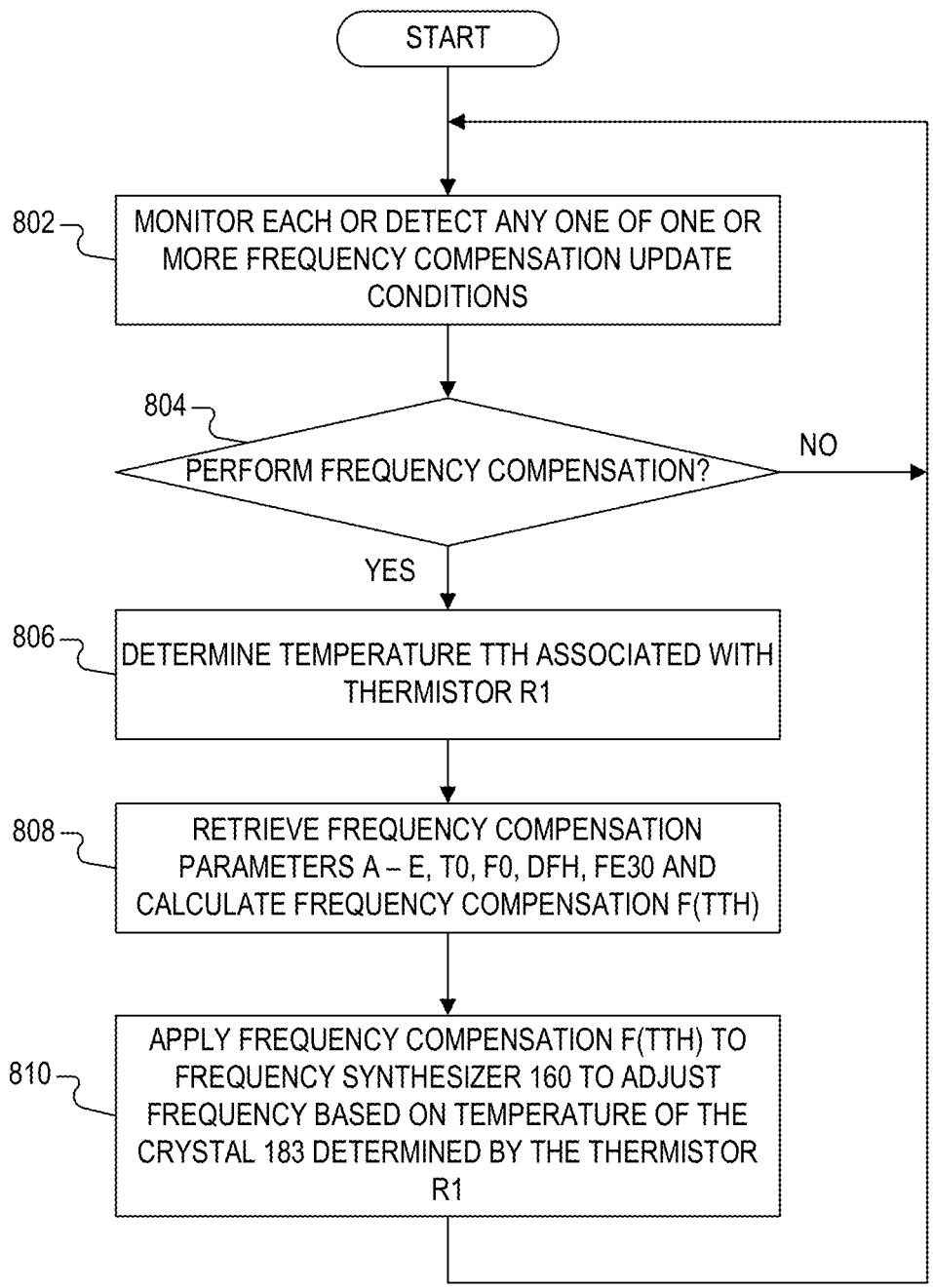
FIG. 8 is a flowchart diagram illustrating temperature compensation based on temperature during run-time operation of the system of FIG. 1 or FIG. 2 according to one embodiment.

FIG. 8 is a flowchart diagram illustrating temperature compensation based on temperature during run-time operation of the system 100 or 200 according to one embodiment. The functions may be performed by the microcontroller 140, such as controlled by firmware or application software or the like. At first block 802, one or more temperature compensation update conditions are monitored or otherwise any one or more of the conditions are detected. The particular update conditions may depend upon the particular application or configuration. One update condition may be initial power up or reset in which the temperature of the thermistor R1 is otherwise unknown. In a Wi-Fi application, a device may wake up periodically in which an update may performed upon each wake-up event. Another update condition may be based on a periodic timer in which an update is scheduled periodically based on expiration of the timer. Another update condition may be a change in on-chip temperature detected by any one or more of the temperature sensor(s) 195 by at least a threshold amount. Another update condition may be a subsequent determination of TTH that indicates a change in temperature of the crystal 183 by at least a threshold amount. Another update condition may be a change of the frequency output from the frequency synthesizer 160 by at least a threshold amount indicating that an update may be needed. At block 804, it is queried whether any one or more of the update conditions have occurred such that temperature compensation should be performed. If not, then operation loops between blocks 802 and 804.

When it is determined at block 804 that temperature compensation should be performed, operation proceeds to block 806 in which the temperature TTH associated with the thermistor R1 is determined in a similar manner previously described if not already known. Operation then advances to block 808 in which the temperature compensation values A-E, T0, F0, DFH, and FE30 are retrieved and the temperature compensation amount F(TTH) is determined using the retrieved compensation values according to equation (3). Operation advances to block 810 in which the determined temperature compensation F(TTH) is applied to adjust the operating frequency of the frequency synthesizer 160 based on the measure temperature of the crystal 183. Operation then loops back to block 802 to repeat the process of monitoring, detecting and temperature compensation.

The adjustment of the load capacitors C3 and C4 during production (block 516) removes about +/−10 ppm frequency error at room temperature. The temperature compensation of a crystal as described herein calibrates about +/−26 ppm frequency error over an extended temperature range of −40° C. to 95° C. and an additional +/−8 ppm frequency error remaining tolerance at 95° C. with respect to a nominal crystal at 95° C. The overall frequency error budget, however, may include additional errors, including +/−1 ppm production equipment calibration frequency error, +/−2 ppm production temperature induced calibration error, +/−2 ppm frequency error for crystal shape change from nominal, +/−1 ppm frequency error caused by solder reflow, +/−3 ppm frequency error due to aging, +/−3 ppm frequency error reference oscillator pulling due to die temperature, +/−3 ppm frequency error temperature sensor accuracy (+/−3° C.), and +/−5 ppm frequency error caused by frequency shift since previous temperature compensation function call.

The sum of the above frequency errors is about +/−20 ppm over the extended temperature range from −40° C. to 95° C. The error is about +/−25 ppm for sum of similar errors over the temperature range from −40° C. to 115° C. The error is about +/−27 ppm for sum of similar errors over the temperature range from −40° C. to 95° C. if only a single temperature production test is used. It is noted, however, that the accumulated sums represent a maximum error condition when all of the errors align in either the positive or the negative direction. In a practical configuration, the contribution of some frequency errors may be positive while others negative so that a certain amount of the frequency error cancels resulting in lower overall frequency error for most practical configurations.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. An integrated circuit that performs temperature compensation for a crystal oscillator based on temperature of an externally coupled crystal of the crystal oscillator, comprising:
   a clock circuit that generates a clock signal based on an oscillation signal of the crystal oscillator;
   a memory that stores a plurality of compensation values including a plurality of nominal values of a nominal third order polynomial equation that defines a nominal frequency versus temperature relationship of a crystal design that represents a plurality of crystals, and further including a plurality of adjustment values derived from said plurality of nominal values and two temperature-frequency error points that were measured using the coupled crystal;
   a voltage interface that develops a sense voltage indicative of a temperature of the coupled crystal; and
   a controller that determines a temperature value based on said sense voltage, that calculates a frequency offset using said temperature value and said plurality of compensation values to convert said nominal third order polynomial equation into a compensated third order polynomial equation more accurately defining a compensated frequency versus temperature relationship of the coupled crystal, and that adjusts a frequency of said clock signal based on said frequency offset.

2. The integrated circuit of claim 1, wherein said clock circuit comprises a frequency synthesizer generating said clock signal, wherein said controller applies said frequency offset to said frequency synthesizer to adjust a frequency of said clock signal.

3. The integrated circuit of claim 1, wherein said sense voltage is developed across a thermistor thermally coupled to the coupled crystal and developing said sense voltage via said voltage interface.

4. The integrated circuit of claim 1, wherein said compensated frequency versus temperature relationship of the coupled crystal is defined within an extended temperature range for industrial applications providing sufficient temperature compensation for wireless networks with medium level accuracy operating within said extended temperature range.

5. The integrated circuit of claim 1, wherein said two temperature-frequency error points comprise a frequency error at a first temperature within a relatively wide room temperature range and a delta frequency at a second temperature within a relatively wide hot temperature range.

6. The integrated circuit of claim 5, wherein said frequency error and said delta frequency are both measured by measuring a starting temperature, measuring a frequency error, measuring an ending temperature, and averaging said starting and ending temperatures.

7. The integrated circuit of claim 5, wherein said first and second temperatures are measured using a thermistor thermally coupled to the coupled crystal and that is coupled to said voltage interface and used to develop said sense voltage indicative of a temperature of the coupled crystal.

8. The integrated circuit of claim 5, wherein said frequency offset comprises a value F(TTH) which is determined as $F(TTH)=A*(TTH-T0)^3+(B*DFH+C)*(TTH-T0)^2+(D*DFH+E)*(TTH-T0)+F0+FE30$, wherein TTH comprises said temperature value determined by said controller based on said sense voltage, wherein A, B, C, D, and E are nominal coefficients with a nominal value of DFH, wherein T0 comprises a nominal temperature value, wherein F0 comprises a corresponding nominal frequency error value, wherein FE30 comprises said frequency error at a first temperature within a room temperature range, and wherein DFH comprises said delta frequency at a second temperature within a hot temperature range.

9. The integrated circuit of claim 8, wherein said first temperature comprises any temperature within said room temperature range comprising 20 to 32 degrees Celsius, and wherein said second temperature comprises any temperature within said hot temperature range comprising 70 to 85 degrees Celsius.

10. The integrated circuit of claim 1, further comprising:
    a crystal interface that develops said oscillation signal;
    a frequency divider circuit receiving said oscillation signal and providing a switching frequency;
    a thermistor thermally coupled to the coupled crystal and developing said sense voltage via said voltage interface;
    a switched capacitor coupled between a supply voltage and said voltage interface, wherein an equivalent resistance of said switched capacitor is controlled by said switching frequency; and
    an analog to digital converter the converts said sense voltage to a digital sense value provided to said controller;
    wherein said controller controls said frequency divider circuit to adjust said switching frequency to adjust said equivalent resistance of said switched capacitor, calculates a thermistor resistance of said thermistor based on said supply voltage, said digital sense value, and said equivalent resistance of said switched capacitor, and determines said temperature value based on said thermistor resistance.

11. An oscillator circuit with temperature compensation, comprising:
    a crystal oscillator including a crystal that provides an oscillation signal;
    a temperature sensor coupled to said crystal of said crystal oscillator that provides a temperature sense signal indicative of a temperature of said crystal;
    a frequency synthesizer having an input receiving said oscillation signal, having an output providing a clock signal, and having an adjust input for adjusting a frequency of said clock signal;
    a memory that stores a plurality of compensation values including a plurality of nominal values of a nominal third order polynomial that defines a nominal frequency versus temperature relationship of a crystal design that represents a plurality of crystals, and further including a plurality of adjustment values derived from said plurality of nominal values and two temperature-frequency error points that were measured using said crystal; and
    a controller that determines a temperature value based on said temperature sense signal, that calculates a frequency offset using said temperature value and said plurality of compensation values to convert said nominal third order polynomial equation into a compensated third order polynomial equation defining a compensated frequency versus temperature relationship of said crystal, and that provides an adjust signal to said adjust input of said frequency synthesizer based on said frequency offset.

12. The oscillator circuit of claim 11, wherein said compensated frequency versus temperature relationship of said crystal is defined within an extended temperature range for industrial applications providing sufficient temperature compensation for wireless networks having medium level accuracy operating within said extended temperature range.

13. The oscillator circuit of claim 11, wherein said two temperature-frequency error points comprise a frequency error at a first temperature within a relatively wide room temperature range and a delta frequency at a second temperature within a relatively wide hot temperature range.

14. The oscillator circuit of claim 13, wherein said frequency offset comprises a value F(TTH) which is determined as $F(TTH)=A*(TTH-T0)^3+(B*DFH+C)*(TTH-T0)^2+(D*DFH+E)*(TTH-T0)+F0+FE30$, wherein TTH comprises said temperature value determined by said controller based on said sense voltage, wherein A, B, C, D, and E are nominal coefficients with a nominal value of DFH, wherein T0 comprises a nominal temperature value, wherein F0 comprises a corresponding nominal frequency error value, wherein FE30 comprises said frequency error at a first temperature within a room temperature range, and wherein DFH comprises said delta frequency at a second temperature within a hot temperature range.

15. The oscillator circuit of claim 14, wherein said first temperature comprises any temperature within said room temperature range comprising 20 to 32 degrees Celsius, and wherein said second temperature comprises any temperature within said hot temperature range comprising 70 to 85 degrees Celsius.

16. The oscillator circuit of claim 11, further comprising:
a frequency divider having an input receiving said oscillation signal and an output providing a switching frequency;
said temperature sensor comprising a thermistor thermally coupled to said crystal and to a sense node developing said temperature sense signal via said sense node;
a switched capacitor coupled between a supply voltage and said sense node, wherein an equivalent resistance of said switched capacitor is controlled by said switching frequency;
an analog to digital converter the converts said temperature sense voltage to a digital sense value provided to said controller; and
wherein said controller controls said oscillation circuit to adjust said switching frequency, calculates a thermistor resistance of said thermistor based on said supply voltage, said digital sense value, and said equivalent resistance of said switched capacitor, and determines said temperature value based on said thermistor resistance.

17. A method of performing temperature compensation based on temperature of a crystal, comprising:
providing a clock signal based on an oscillation signal generated by oscillation of the crystal;
storing compensation values including nominal values of a nominal third order polynomial equation that defines a nominal frequency versus temperature relationship of a crystal design that represents a plurality of crystals, and further including a plurality of adjustment values derived from the nominal values and two temperature-frequency error points that were measured using the crystal;
receiving a sense voltage indicative of a temperature of the crystal and determining a temperature value based on the sense voltage;
calculating a frequency offset using the temperature value and the plurality of compensation values to convert the nominal third order polynomial equation into a compensated third order polynomial equation defining a compensated frequency versus temperature relationship of the crystal; and
adjusting the clock signal based on the frequency offset.

18. The method of claim 17, further comprising thermally coupling a thermistor to the crystal for providing the sense voltage.

19. The method of claim 17, wherein said calculating a frequency offset comprises calculating a value, wherein $F(TTH)=A*(TTH-T0)^3+(B*DFH+C)*(TTH-T0)^2+(D*DFH+E)*(TTH-T0)+F0+FE30$, wherein F(TTH) comprises the frequency offset, TTH comprises the temperature value determined by the controller based on the sense voltage, A, B, C, D, E, T0, and F0 are the nominal values, and FE30 and DFH comprise the adjustment values.

20. The method of claim 17, wherein said adjusting the clock signal comprises adjusting a frequency of a frequency synthesizer using the frequency offset.

\* \* \* \* \*